(12) United States Patent
Lee et al.

(10) Patent No.: US 8,106,718 B2
(45) Date of Patent: Jan. 31, 2012

(54) GM-BOOSTED DIFFERENTIAL DRAIN-TO-SOURCE FEEDBACK COLPITTS VOLTAGE CONTROLLED OSCILLATOR

(75) Inventors: Sang-Gug Lee, Daegu (KR); Jong-Phil Hong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 72 days.

(21) Appl. No.: 12/690,136

(22) Filed: Jan. 20, 2010

(65) Prior Publication Data

US 2010/0289592 A1 Nov. 18, 2010

(30) Foreign Application Priority Data

May 15, 2009 (KR) .................. 10-2009-0042587

(51) Int. Cl.
*H03B 5/08* (2006.01)
(52) U.S. Cl. .............. 331/167; 331/117 FE; 331/117 R
(58) Field of Classification Search .............. 331/167, 331/177 R, 117 FE, 117 V
See application file for complete search history.

(56) References Cited

U.S. PATENT DOCUMENTS

| 6,593,825 | B1 * | 7/2003 | Washburn | 331/117 FE |
| 7,199,675 | B2 * | 4/2007 | Lee et al. | 331/117 FE |
| 2008/0111644 | A1 * | 5/2008 | Jang et al. | 331/167 |
| 2008/0290957 | A1 | 11/2008 | Li et al. | |

FOREIGN PATENT DOCUMENTS

KR 10-0759933 B1 9/2007

OTHER PUBLICATIONS

Aparicio et al, A Noise-Shifting Differential Colpitts VCO, IEEE Journal of Solid-State Circuits, vol. 37, No. 12, Dec. 2002.
Li et al., GM-Boosted Common-Gate LNA and Differential Colpitts VCO/QVCO in 0.18-um CMOS, Dec. 2005.

\* cited by examiner

*Primary Examiner* — Joseph Chang
*Assistant Examiner* — Jeffrey Shin
(74) *Attorney, Agent, or Firm* — Gifford, Krass, Sprinkle, Anderson & Citkowski, P.C.

(57) ABSTRACT

A voltage controlled oscillator outputting a differential signal includes: an inductor connected to a first power supply supplying first voltage; first and second transistors for differential switching; first and second variable capacitors connected to the inductor in parallel; a third transistor of which a gate electrode is connected to a first node; and a fourth transistor of which a gate electrode is connected to a second node. When bias voltage is applied to the gate electrode of the first transistor to be turned on, negative resistance is generated by voltage applied to the first capacitor and the second capacitor through the first transistor. When voltage outputted through the first node is applied to the gate electrode of the third transistor to be turned on, the voltage is additionally applied to the first capacitor and the second capacitor by the third transistor to increase the negative resistance.

11 Claims, 8 Drawing Sheets

GM-BOOSTED DIFFERENTIAL DRAIN-TO-SOURCE FEEDBACK COLPITTS VOLTAGE CONTROLLED OSCILLATOR

CROSS-REFERENCE TO RELATED APPLICATION

This application claims priority to and the benefit of Korean Patent Application No. 10-2009-0042587 filed in the Korean Intellectual Property Office on May 15, 2009, the entire contents of which are incorporated herein by reference.

BACKGROUND OF THE INVENTION (a) Field of the Invention

The present invention relates to a differential Colpitts voltage controlled oscillator for improving negative resistance, and more particularly, to a voltage controlled oscillator for improving negative resistance of a Colpitts oscillator.

(b) Description of the Related Art

In recent years, a complementary metal-oxide semiconductor (CMOS) process technology has been rapidly being developed according to a request for integration by technological convergence. However, low voltage and an increase of flicker noise by the CMOS process technology are being magnified as a problem to be solved in order to design an analog circuit. In particular, a decrease of output voltage and the increase of the flicker noise may cause deterioration of phase noise performance at the time of designing a voltage controlled oscillator by the CMOS process technology.

As such, a Colpitts voltage controlled oscillator is being attracting attention as a structure for solving the problem caused at the time of designing the voltage controlled oscillator by the CMOS process technology, but start-up current and power consumptions may be large and the phase noise performance may deteriorate due to small oscillation amplitude.

Accordingly, a design technology of a voltage controlled oscillator is required, which is capable of reducing the start-up current and power consumptions and improving the phase noise performance of the oscillator at the operating point of the maximum saturation region.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to a Colpitts voltage controlled oscillator having an advantage of improving negative resistance.

An exemplary embodiment of the present invention provides a voltage controlled oscillator outputting a differential signal that includes:

an inductor connected to a first power supply supplying first voltage; first and second transistors of which drain electrodes are connected to one terminal and the other terminal of the inductor, respectively and for differential switching; first and second variable capacitors that are connected between the first transistor and the second transistor in serial and connected to the inductor in parallel; a third transistor of which a drain electrode is connected to a source electrode of the first transistor and a gate electrode is connected to a first node connected to the inductor, the second variable capacitor, and the second transistor; and a fourth transistor of which a drain electrode is connected to a source electrode of the second transistor and a gate electrode is connected to a second node connected to the inductor, the first variable capacitor, and the first transistor.

Another embodiment of the present invention provides a voltage controlled oscillator outputting a differential signal that includes:

an inductor connected to a first power supply supplying first voltage; first and second transistors that are differentially turned on and turned off by being connected to the inductor, respectively; a third transistor of which a drain electrode is connected to a source electrode of the first transistor and a gate electrode is connected to a first node connected to the inductor and the second transistor; a fourth transistor of which a drain electrode is connected to a source electrode of the second transistor and a gate electrode is connected to a second node connected to the inductor and the first transistor; a first capacitor that is connected to the first transistor in parallel and of which one terminal is connected to the second node; a first variable capacitor and a second capacitor of which terminals are connected to the first capacitor and a third node connected with the source electrode of the first transistor and the drain electrode of the third transistor; a third capacitor that is connected to the second transistor in parallel and of which one terminal is connected to the first node; and a second variable capacitor and a fourth capacitor of which terminals are connected to the third capacitor and a fourth node connected with the source electrode of the second transistor and the drain electrode of the fourth transistor, wherein the first variable capacitor is connected with the second capacitor in parallel and the second variable capacitor is connected with the fourth capacitor in parallel.

DETAILED DESCRIPTION OF THE EMBODIMENTS

Figure 1:
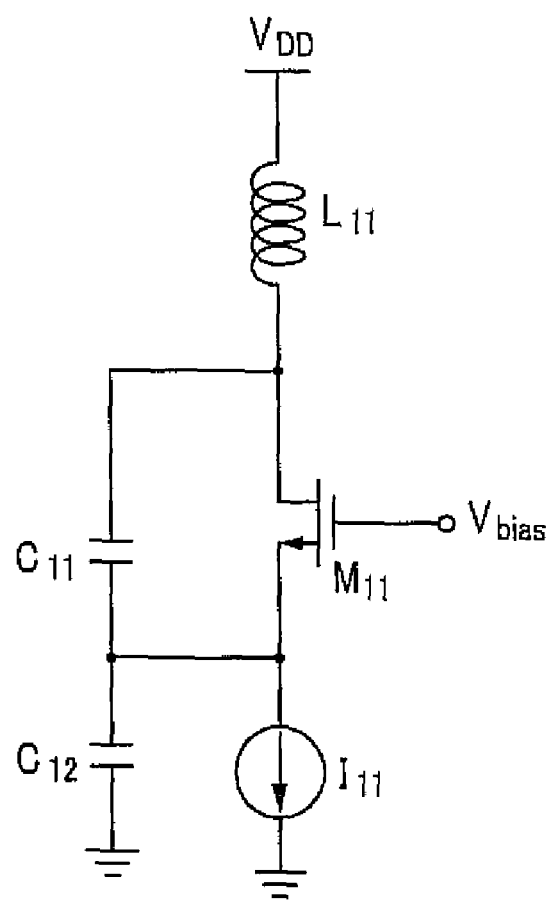
FIG. 1 is a diagram showing one example of a known Colpitts oscillator.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Figure 2:
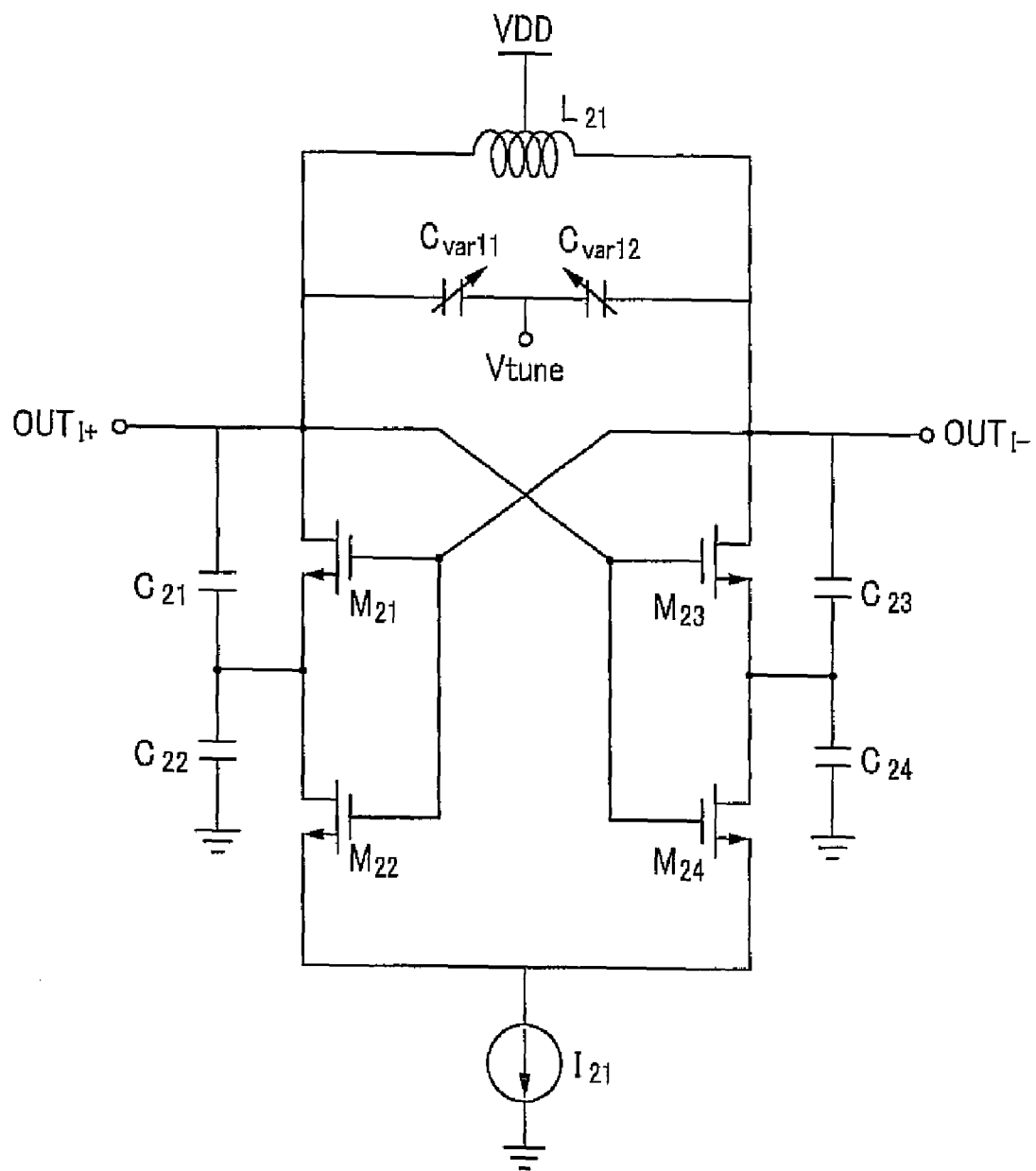
FIG. 2 is a diagram showing another example of a known Colpitts oscillator.

FIG. 1 is a diagram showing one example of a known Colpitts oscillator and FIG. 2 is a diagram showing another example of a known Colpitts oscillator.

The known Colpitts oscillator 100 shown in FIG. 1 has a single output structure and includes a transistor $M_{11}$, an inductor $L_{11}$, capacitors $C_{11}$ and $C_{12}$, and a current source $I_{11}$.

The Colpitts oscillator 100 has excellent phase noise performance, but is not widely used due to a problem in that start-up current and power consumptions are large due to small negative resistance.

Meanwhile, the known Colpitts oscillator 200 shown in FIG. 2 has a differential output structure and includes transistors $M_{21}$, $M_{22}$, $M_{23}$, and $M_{24}$, an inductor $L_{21}$, capacitors $C_{21}$, $C_{22}$, $C_{23}$, and $C_{24}$, variable capacitors $C_{var11}$ and $C_{var12}$, and a current source $I_{21}$.

The Colpitts oscillator 200 consumes low power by improving the negative resistance according to the differential output structure unlike the Colpitts oscillator 100 shown in FIG. 1. That is, the Colpitts oscillator 200 is designed to connect gate electrodes of the transistor $M_{23}$ and the transistor $M_{24}$ to an output terminal $OUT_{I+}$ and connect gate electrodes of the transistor $M_{21}$ and the transistor $M_{22}$ to an output terminal $OUT_{I-}$ to increase the negative resistance and reduce the start-up current and power consumptions by the increase of the negative resistance. However, the Colpitts oscillator 200 has a problem in that phase noise performance deteriorates at an operating point of a maximum saturation region.

Hereinafter, referring to FIGS. 3 to 7B, a differential Colpitts oscillator 300 according to an embodiment of the present invention will be described in detail, which is capable of reducing the start-up current and power consumptions and improving the phase noise performance of an oscillator at the operating point of the maximum saturation region by improving the negative resistance and oscillation amplitude while having the differential output structure.

Figure 3:
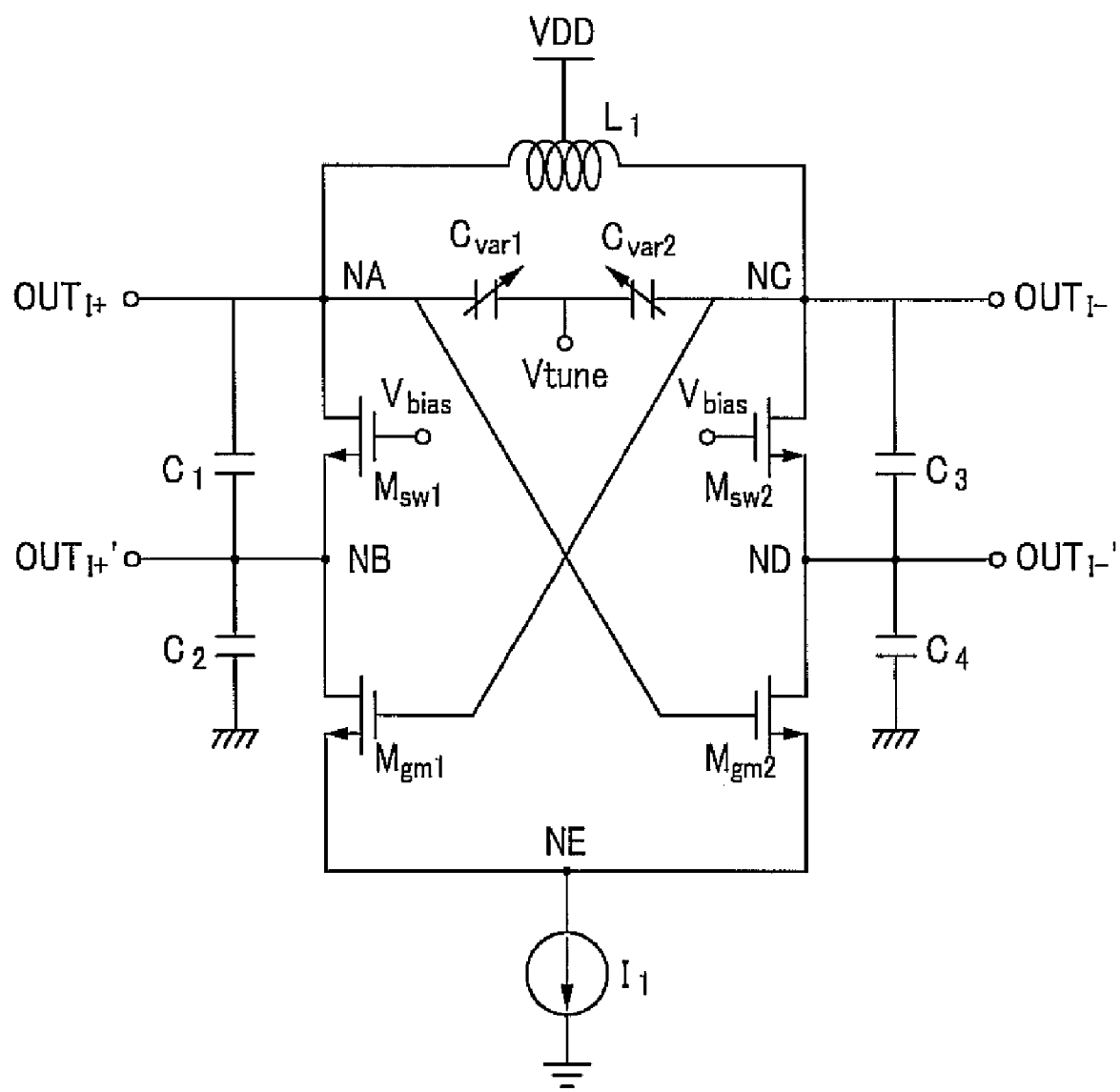
FIG. 3 is a diagram schematically showing one example of a differential Colpitts oscillator according to an embodiment of the present invention.

FIG. 3 is a diagram schematically showing one example of a gm-boosted differential drain-to-source feedback Colpitts voltage controlled oscillator, that is, a differential Colpitts oscillator according to an embodiment of the present invention.

In FIG. 3, transistors $M_{sw1}$, $M_{sw2}$, $M_{gm1}$, and $M_{gm2}$ of the differential Colpitts oscillator 300 are shown as an n-channel metal oxide semiconductor (NMOS) transistor, but the present invention is not limited thereto and other transistors having a similar function to the NMOS transistor may be used as the transistors $M_{sw1}$, $M_{sw2}$, $M_{gm1}$, and $M_{gm2}$ instead of the NMOS transistor.

As shown in FIG. 3, the differential Colpitts oscillator 300 according to the embodiment of the present invention includes a pair of transistors $M_{sw1}$ and $M_{sw2}$ for generating the negative resistance and a pair of transistors $M_{gm1}$ and $M_{gm2}$ for increasing the negative resistance that are connected to each other in the differential output structure, an inductor $L_1$, variable capacitors $C_{var1}$ and $C_{var2}$, capacitors $C_1$, $C_2$, $C_3$, and $C_4$, and a current source $I_1$.

The inductor $L_1$ is connected to a power supply VDD and one terminal of the inductor $L_1$ is connected to a drain electrode of the transistor $M_{sw1}$ and the other terminal of the inductor $L_1$ is connected to a drain of the transistor $M_{sw2}$. One terminal of the variable capacitor $C_{var1}$ is connected to a node NA which is a contact point between the drain electrode of the transistor $M_{sw1}$ and one terminal of the inductor $L_1$ and the other terminal is connected to one terminal of the variable capacitor $C_{var2}$. The other terminal of the variable capacitor $C_{var2}$ is connected to a node NC which is a contact point between the drain electrode of the transistor $M_{sw2}$ and the other terminal of the inductor $L_1$. At this time, voltage $V_{tune}$ is supplied to the variable capacitors $C_{var1}$ and $C_{var2}$ to change values of the capacitors and the frequency of an output signal is changed depending on the changed capacitor value. Herein, the inductor $L_1$ and the variable capacitors $C_{var1}$ and $C_{var2}$ are connected to each other in parallel.

The drain electrode of the transistor $M_{sw1}$ is connected to one terminal of the inductor $L_1$ and a source electrode of the transistor $M_{sw1}$ is connected to a drain electrode of the transistor $M_{gm1}$. At this time, direct current DC as bias voltage $V_{bias}$ is applied to a gate electrode of the transistor $M_{sw1}$ and an output terminal $OUT_{I+}$ is connected to the node NA. One terminal of the capacitor $C_1$ is connected to the node NA and the output terminal $OUT_{I+}$ and the other terminal of the capacitor $C_1$ is connected to a node NB which is a contact point between the source of the transistor $M_{sw1}$ and the drain of the transistor $M_{gm1}$. One terminal of the capacitor $C_2$ is connected to the node NB and the other terminal of the capacitor $C_1$ and the other terminal of the capacitor $C_2$ is connected to a power supply GND.

The drain electrode of the transistor $M_{sw2}$ is connected to the other terminal of the inductor $L_1$ and a source electrode of the transistor $M_{sw2}$ is connected to a drain electrode of the transistor $M_{gm2}$. At this time, the direct current DC as the bias voltage $V_{bias}$ is applied to a gate electrode of the transistor $M_{sw2}$ and an output terminal $OUT_{I-}$ is connected to the node NC. One terminal of the capacitor $C_3$ is connected to the node NC and the output terminal $OUT_{I-}$ and the other terminal of the capacitor $C_3$ is connected to a node ND which is a contact point between the source of the transistor $M_{sw2}$ and the drain of the transistor $M_{gm2}$. One terminal of the capacitor $C_4$ is connected to the node ND and the other terminal of the capacitor $C_3$ and the other terminal of the capacitor $C_4$ is connected to the power supply GND.

Herein, a gate electrode of the transistor $M_{gm1}$ is connected to the node NC and a gate electrode of the transistor $M_{gm2}$ is connected to the node NA. In addition, a node NE which is a contact point between a source electrode of the transistor $M_{gm1}$ and a source electrode of the transistor $M_{gm2}$ is connected to one terminal of the current source $I_1$. At this time, the current source $I_1$ generates constant bias current and provides high impedance to a high-frequency component to achieve a complete differential operation.

Figure 4:
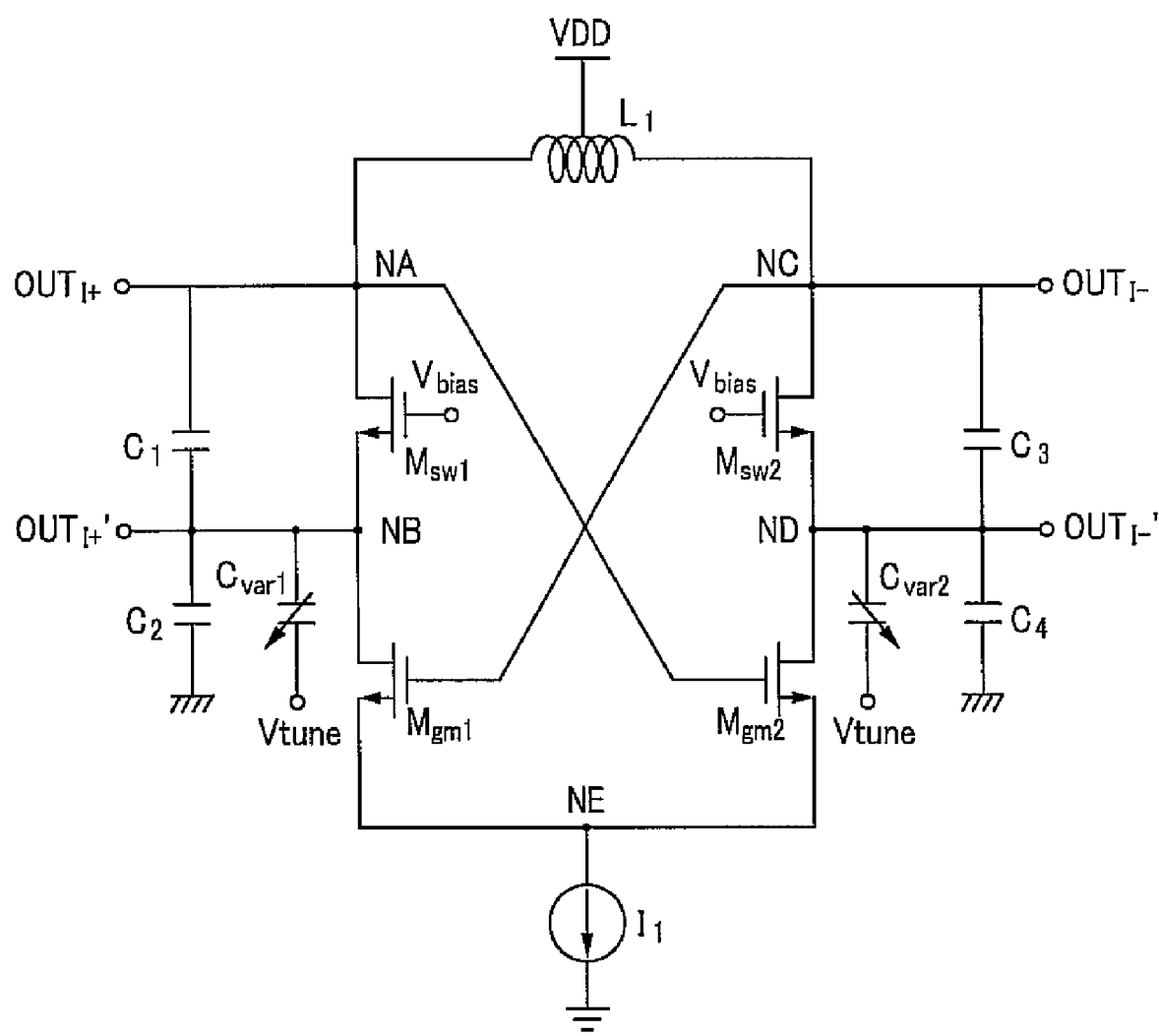
FIG. 4 is a diagram schematically showing another example of a differential Colpitts oscillator according to an embodiment of the present invention.

FIG. 4 is a diagram schematically showing another example of a differential Colpitts oscillator according to an embodiment of the present invention Although the variable capacitors $C_{var1}$ and $C_{var2}$ are connected to the inductor $L_1$ in parallel like in the differential Colpitts oscillator 300, in the differential Colpitts oscillator 300' according to another embodiment of the present invention, the variable capacitor $C_{var1}$ is connected to the capacitor $C_2$ in parallel and the variable capacitor $C_{var2}$ is connected to the capacitor $C_4$ in parallel as shown in FIG. 4. Then, the differential Colpitts oscillator 300' has a broadband characteristic of the variable capacitors $C_{var1}$ and $C_{var2}$ caused due to the decrease of the output voltage. Herein, the differential Colpitts oscillator 300' has the same configuration as the differential Colpitts oscillator 300 except that the variable capacitors $C_{var1}$ and $C_{var2}$ are connected to the capacitors $C_2$ and $C_4$ in parallel, respectively. Therefore, a detailed description thereof will be omitted.

In the differential Colpitts oscillators 300 and 300', the output terminal $OUT_{I+}$ is connected to the node NA which is the contact point between the drain electrode of the transistor $M_{sw1}$ and one terminal of the inductor $L_1$ and the output terminal $OUT_{I-}$ is connected to the node NC which is the contact point between the drain electrode of the transistor $M_{sw2}$ and the other terminal of the inductor $L_1$, but the present invention is not limited thereto and an output terminal $OUT_{I+}'$ may be connected to the node NB which is the contact point between the source of the transistor $M_{sw1}$ and the drain of the transistor $M_{gm1}$ and an output terminal $OUT_{I-}'$ may be connected to the node ND which is the contact point between the source of the transistor $M_{sw2}$ and the drain of the transistor $M_{gm2}$. At this time, since the output terminal $OUT_{I+}'$ uses a drain output of the transistor $M_{gm1}$ and the output terminal $OUT_{I-}'$ uses a drain output of the transistor $M_{gm2}$, it is possible to improve a frequency error by reducing a process deviation caused due to a parasite component.

Figure 5:
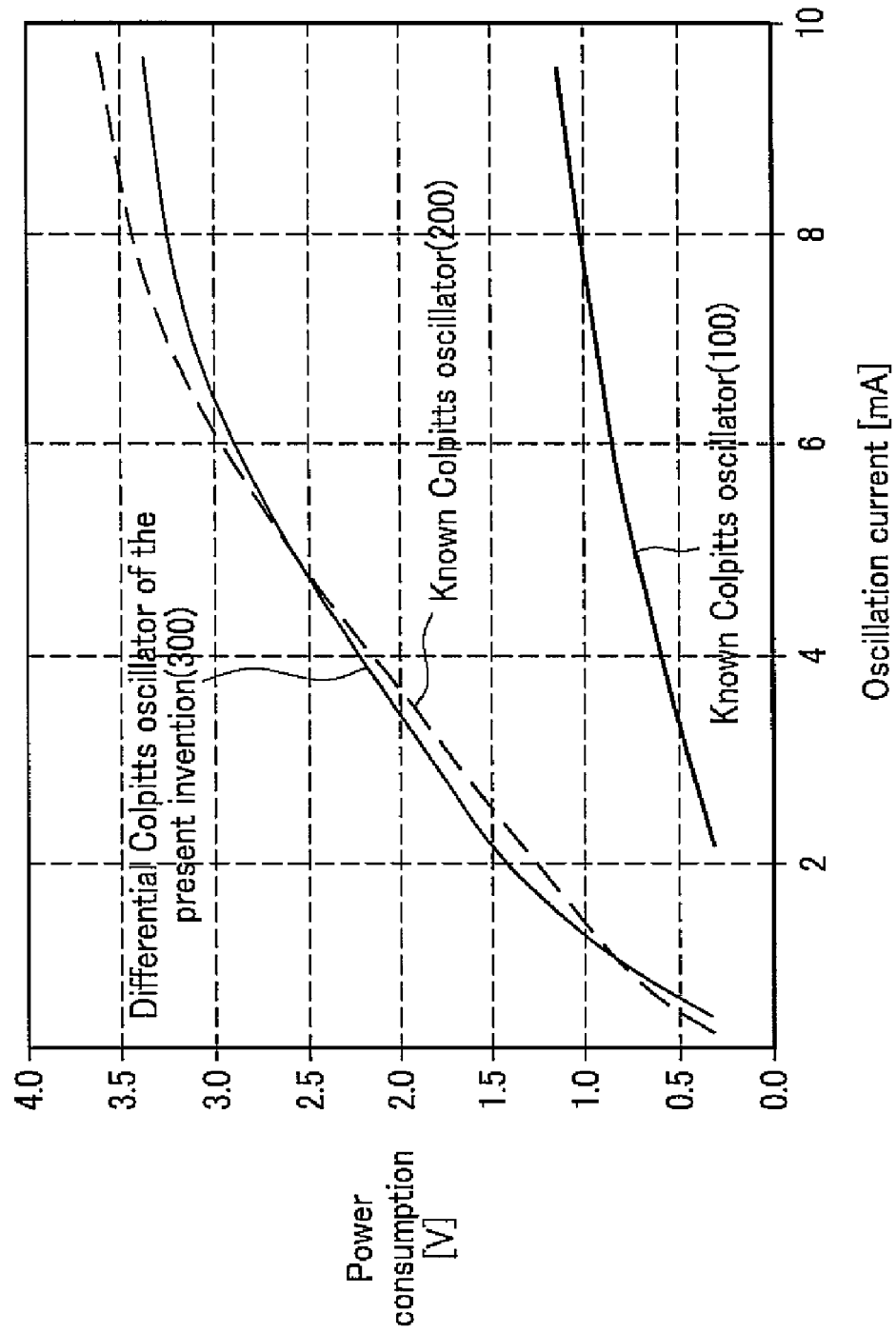
FIG. 5 is a diagram showing one example of output voltage of a differential Colpitts oscillator according to an embodiment of the present invention.
Figure 6:
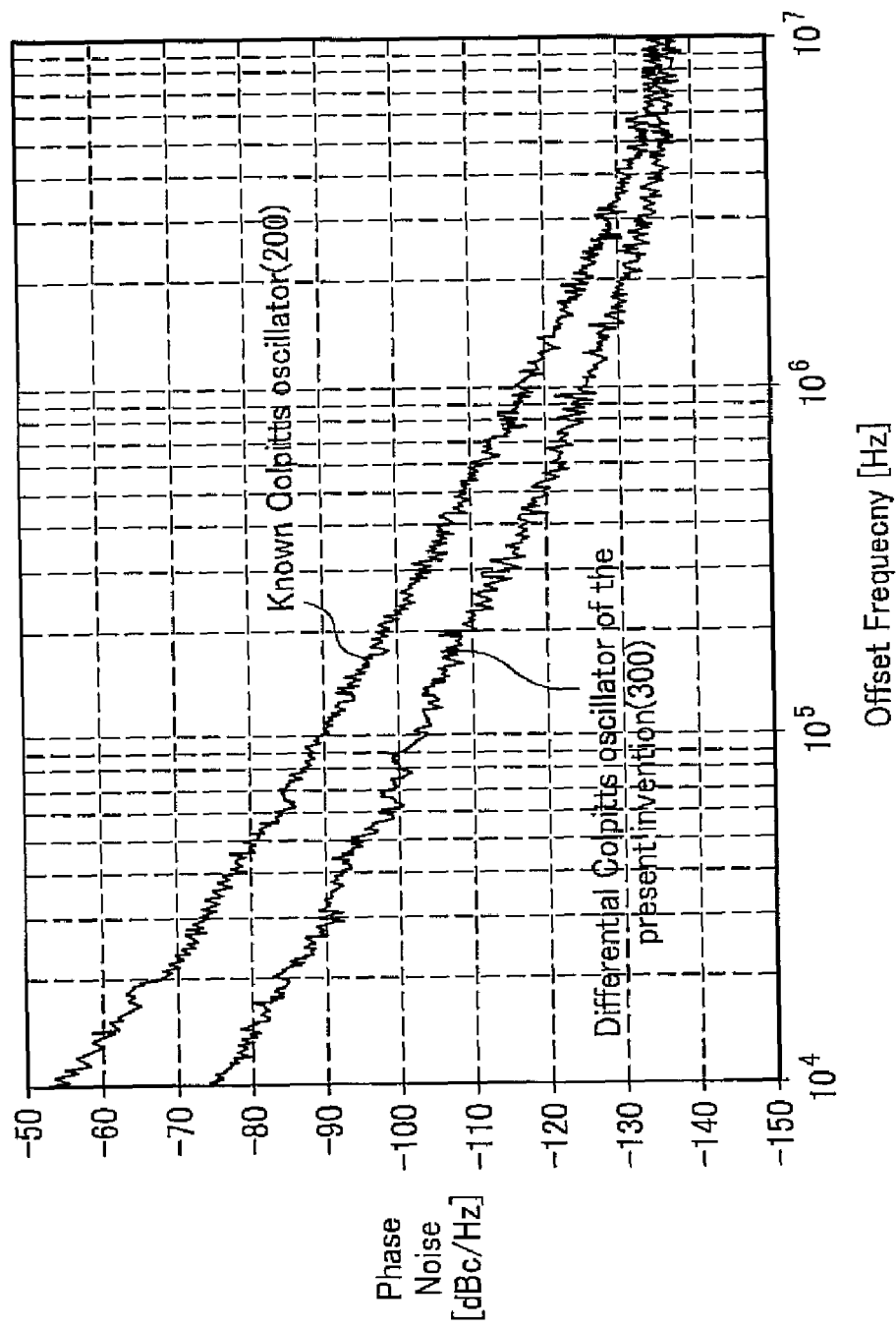
FIG. 6 is a diagram showing one example of a measurement value of phase noise of a differential Colpitts oscillator according to an embodiment of the present invention.
Figure 7A:
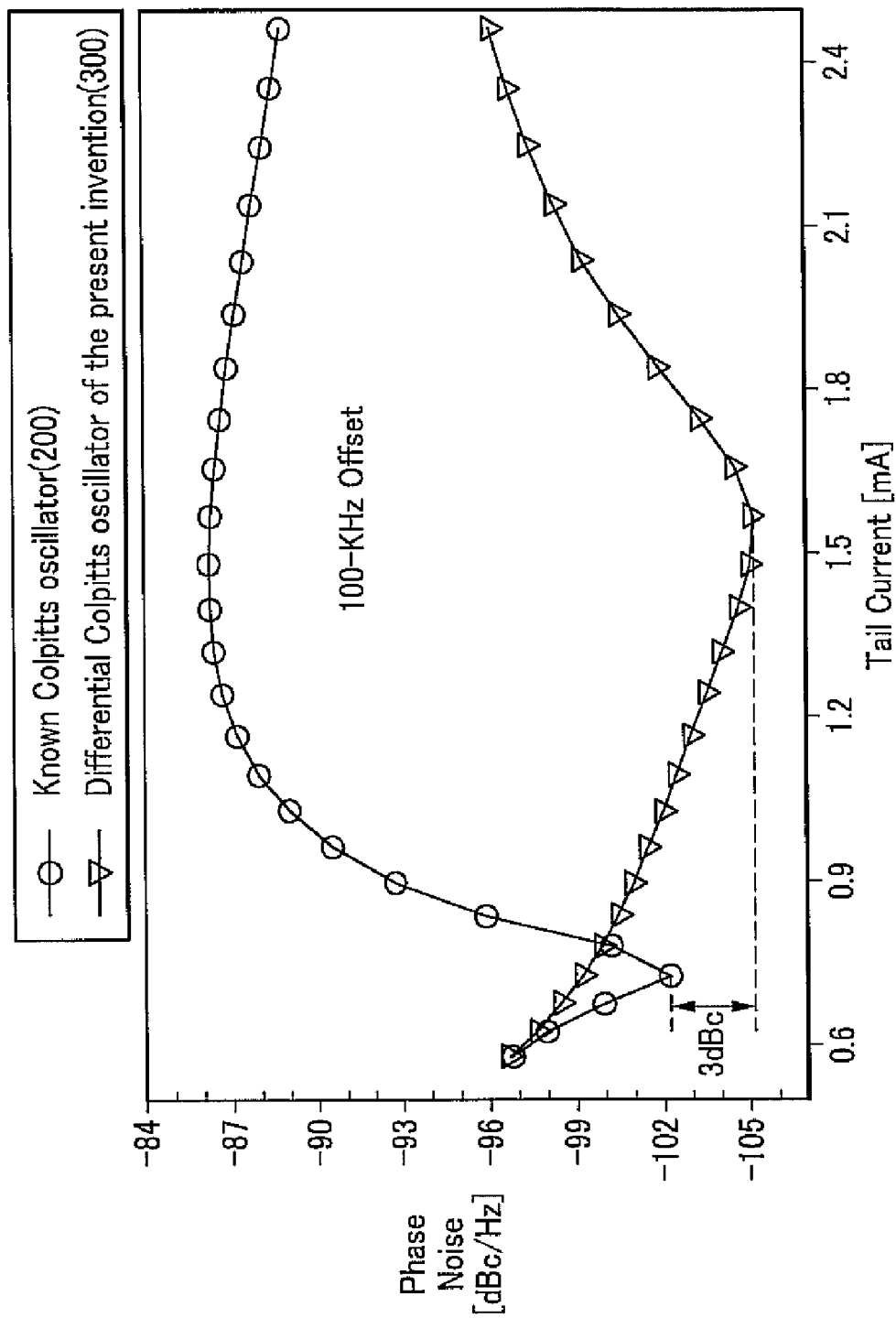
FIGS. 7A and 7B are diagrams showing one example of phase noise performance of a differential Colpitts oscillator according to an embodiment of the present invention.
Figure 7B:
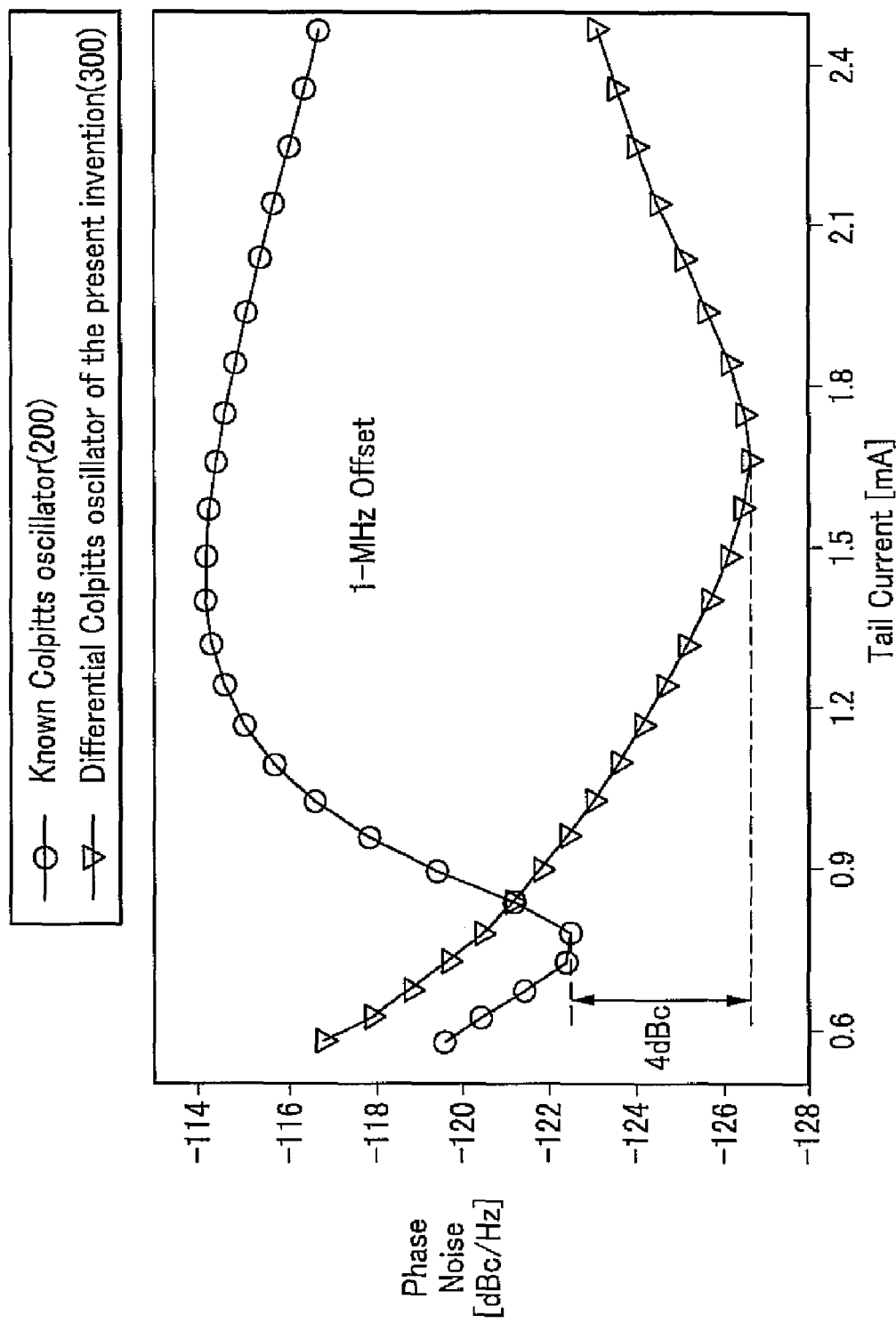

FIG. 5 is a diagram showing one example of output voltage of a differential Colpitts oscillator according to an embodiment of the present invention. FIG. 6 is a diagram showing one example of a measurement value of phase noise of a differential Colpitts oscillator according to an embodiment of the present invention. FIGS. 7A and 7B are diagrams showing one example of phase noise performance of a differential Colpitts oscillator according to an embodiment of the present invention.

Referring to FIGS. 3 and 5, in the differential Colpitts oscillator according to the embodiment of the present invention, when the bias voltage $V_{bias}$ is applied to the gate electrode of the transistor $M_{sw1}$, which is turned on, the capacitor $C_1$ and the capacitor $C_2$ generate negative resistance $R_Y$ by voltage applied through the turned on transistor $M_{sw1}$. At this time, voltage outputted by the inductor $L_1$ and the variable capacitors $C_{var1}$ and $C_{var2}$ is applied to the gate electrode of the transistor $M_{gm1}$, such that the transistor $M_{gm1}$ is turned on and the negative resistance $R_Y$ is increased by additional voltage which is fed back to the capacitors $C_1$ and $C_2$ by the turned on transistor $M_{gm1}$ and is shown in Equation 1.

$$R_Y = -\frac{G_{gm1}}{2} - \frac{G_{sw1}\omega^2 C_1 C_2 - 0.5 G_{gm1}\omega^2 C_2 (C_1 + C_2)}{G_{sw1}^2 + \omega^2 (C_1 + C_2)}$$ (Equation 1)

Herein, $G_{gm1}$ is a trans-conductance of the transistor $M_{gm1}$ and $G_{sw1}$ is a trans-conductance of the transistor $M_{sw1}$.

Likewise, when the bias voltage $V_{bias}$ is applied to the gate electrode of the transistor $M_{sw2}$, which is turned on, the capacitor $C_3$ and the capacitor $C_4$ generate the negative resistance $R_Y$ by voltage applied through the turned on transistor $M_{sw2}$. At this time, the voltage outputted by the inductor $L_1$ and the variable capacitors $C_{var1}$ and $C_{var2}$ is applied to the gate electrode of the transistor $M_{gm2}$, such that the transistor $M_{gm2}$ is turned on and the negative resistance $R_Y$ is increased by additional voltage which is fed back to the capacitors $C_3$ and $C_4$ by the turned on transistor $M_{gm2}$ and is shown in Equation 2.

$$R_Y = -\frac{G_{gm2}}{2} - \frac{G_{sw2}\omega^2 C_1 C_2 - 0.5 G_{gm2}\omega^2 C_2 (C_1 + C_2)}{G_{sw2}^2 + \omega^2 (C_1 + C_2)}$$ (Equation 2)

Herein, $G_{gm2}$ is a trans-conductance of the transistor $M_{gm2}$ and $G_{sw2}$ is a trans-conductance of the transistor $M_{sw2}$.

As such, in the differential Colpitts oscillators 300 and 300' according to the embodiment of the present invention, as shown in FIG. 5, as the negative resistance $R_Y$ increases, the start-up current and power consumptions may decrease in comparison with the known Colpitts oscillator 100. In addition, the differential Colpitts oscillators 300 and 300' are designed to increase the negative resistance in addition to low power consumption which is the merit of the known Colpitts oscillator 200. The differential Colpitts oscillators 300 and 300' can improve the phase noise performance at a low-frequency offset as shown in FIG. 6 in comparison with the known Colpitts oscillator 200.

Further, the differential Colpitts oscillators 300 and 300' are designed to generate larger output voltage at an operating point of the maximum saturation region to improve the phase noise performance in the saturation region unlike the known Colpitts oscillator 200.

For example, as shown in FIG. 7A, at an offset frequency of 100 KHz in an operation of the saturation region, the differential Colpitts oscillators 300 and 300' have phase noise of −102 dBc and the known Colpitts oscillators 200 have phase noise of −105 dBc. Accordingly, the differential Colpitts oscillators 300 and 300' can improve the phase noise performance by 3 dBc in comparison with the known Colpitts oscillator 200. As another example, as shown in FIG. 7B, at an offset frequency of 1 MHz in an operation of a general saturation region, the differential Colpitts oscillators 300 and 300' have phase noise of −126.5 dBc and the known Colpitts oscillator 200 has phase noise of −122.5 dBc. Accordingly, the differential Colpitts oscillators 300 and 300' can improve the phase noise performance by 4 dBc in comparison with the known Colpitts oscillator 200.

As described above, according to an embodiment of the present invention, it is possible to reduce start-up current and power consumptions and improve phase noise performance at an operating point of a maximum saturation region by improving negative resistance and oscillation amplitude.

In addition, according to the embodiment of the present invention, it is possible to improve an oscillation frequency error by means of using a drain output of a boosting transistor for increasing the negative resistance which reduces a process variation by a parasitic component.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A voltage controlled oscillator outputting a differential signal, comprising:
    an inductor connected to a first power supply supplying first voltage;
    first and second transistors of which drain electrodes are connected to one terminal and the other terminal of the inductor, respectively and for differential switching;
    first and second variable capacitors that are connected between the first transistor and the second transistor in serial and connected to the inductor in parallel;
    a third transistor of which a drain electrode is connected to a source electrode of the first transistor and a gate electrode is connected to a first node connected to the inductor, the second variable capacitor, and the second transistor;

a fourth transistor of which a drain electrode is connected to a source electrode of the second transistor and a gate electrode is connected to a second node connected to the inductor, the first variable capacitor, and the first transistor;

a first capacitor that is connected to the first transistor in parallel and of which one terminal is connected to the second node;

a second capacitor of which one terminal is connected to a third node connected to the source electrode of the first transistor and the drain electrode of the third transistor and the first capacitor;

a third capacitor that is connected to the second transistor in parallel and of which one terminal is connected to the first node; and a fourth capacitor of which one terminal is connected to the third capacitor and a fourth node connected to the source electrode of the second transistor and the drain electrode of the fourth transistor, wherein:

when bias voltage is applied to the gate electrode of the first transistor to be turned on, negative resistance is generated by voltage applied to the first capacitor and the second capacitor through the first transistor, and when voltage outputted through the first node is applied to the gate electrode of the third transistor to be turned on, the voltage is additionally increased to the first capacitor and the second capacitor by the third transistor to increase the negative resistance.

2. The voltage controlled oscillator of claim 1, further comprising:
a current source of which one terminal is connected to source electrodes of the third transistor and the fourth transistor and the other terminal is connected to a second power supply supplying second voltage.

3. The voltage controlled oscillator of claim 1, further comprising:
a first output terminal which is connected to one terminal of the first capacitor and the second node to output a positive differential signal; and
a second output terminal which is connected to one terminal of the third capacitor and the first node to output a negative differential signal.

4. The voltage controlled oscillator of claim 1, further comprising:
a third output terminal that is connected between the first capacitor and the second capacitor connected with the third node to output the positive differential signal; and
a fourth output terminal that is connected between the third capacitor and the fourth capacitor connected with the fourth node to output the negative differential signal.

5. A voltage controlled oscillator outputting a differential signal, comprising:
an inductor connected to a first power supply supplying first voltage;
first and second transistors of which drain electrodes are connected to one terminal and the other terminal of the inductor, respectively and for differential switching;
first and second variable capacitors that are connected between the first transistor and the second transistor in serial and connected to the inductor in parallel;
a third transistor of which a drain electrode is connected to a source electrode of the first transistor and a gate electrode is connected to a first node connected to the inductor, the second variable capacitor, and the second transistor;
a fourth transistor of which a drain electrode is connected to a source electrode of the second transistor and a gate electrode is connected to a second node connected to the inductor, the first variable capacitor, and the first transistor;

a first capacitor that is connected to the first transistor in parallel and of which one terminal is connected to the second node;

a second capacitor of which one terminal is connected to a third node connected to the source electrode of the first transistor and the drain electrode of the third transistor and the first capacitor;

a third capacitor that is connected to the second transistor in parallel and of which one terminal is connected to the first node; and a fourth capacitor of which one terminal is connected to the third capacitor and a fourth node connected to the source electrode of the second transistor and the drain electrode of the fourth transistor, wherein:

when the bias voltage is applied to the gate electrode of the second transistor to be turned on, the negative resistance is generated by voltage applied to the third capacitor and the fourth capacitor through the second transistor, and when voltage outputted through the second node is applied to the gate electrode of the fourth transistor to be turned on, the voltage is additionally increased to the third capacitor and the fourth capacitor by the fourth transistor to increase the negative resistance.

6. A voltage controlled oscillator outputting a differential signal, comprising:
an inductor connected to a first power supply supplying first voltage;
first and second transistors that are differentially turned on and turned off by being connected to the inductor, respectively;
a third transistor of which a drain electrode is connected to a source electrode of the first transistor and a gate electrode is connected to a first node connected to the inductor and the second transistor;
a fourth transistor of which a drain electrode is connected to a source electrode of the second transistor and a gate electrode is connected to a second node connected to the inductor and the first transistor;
a first capacitor that is connected to the first transistor in parallel and of which one terminal is connected to the second node;
a first variable capacitor and a second capacitor of which terminals are connected to the first capacitor and a third node connected with the source electrode of the first transistor and the drain electrode of the third transistor;
a third capacitor that is connected to the second transistor in parallel and of which one terminal is connected to the first node; and
a second variable capacitor and a fourth capacitor of which terminals are connected to the third capacitor and a fourth node connected with the source electrode of the second transistor and the drain electrode of the fourth transistor,
wherein the first variable capacitor is connected with the second capacitor in parallel and the second variable capacitor is connected with the fourth capacitor in parallel.

7. The voltage controlled oscillator of claim 6, further comprising:
a current source of which one terminal is connected to source electrodes of the third transistor and the fourth transistor and the other terminal is connected to a second power supply supplying second voltage.

8. The voltage controlled oscillator of claim 7, further comprising:
   a first output terminal which is connected to one terminal of the first capacitor and the second node to output a positive differential signal; and
   a second output terminal which is connected to one terminal of the third capacitor and the first node to output a negative differential signal.

9. The voltage controlled oscillator of claim 7, further comprising:
   a third output terminal that is connected between the first capacitor and the second capacitor connected with the third node to output the positive differential signal; and
   a fourth output terminal that is connected between the third capacitor and the fourth capacitor connected with the fourth node to output the negative differential signal.

10. The voltage controlled oscillator of claim 6, wherein:
   when bias voltage is applied to the gate electrode of the first transistor to be turned on, negative resistance is generated by voltage applied to the first capacitor, the first variable capacitor, and the second capacitor through the first transistor, and
   when voltage outputted through the first node is applied to the gate electrode of the third transistor to be turned on, the voltage is additionally applied to the first capacitor, the first variable capacitor, and the second capacitor by the third transistor to increase the negative resistance.

11. The voltage controlled oscillator of claim 6, wherein:
   when the bias voltage is applied to the gate electrode of the second transistor to be turned on, the negative resistance is generated by voltage applied to the third capacitor, the second variable capacitor, and the fourth capacitor through the second transistor, and
   when voltage outputted through the second node is applied to the gate electrode of the fourth transistor to be turned on, the voltage is additionally applied to the third capacitor, the second variable capacitor, and the fourth capacitor by the fourth transistor to increase the negative resistance.

* * * * *